(12) United States Patent
Kim

(10) Patent No.: US 10,656,474 B2
(45) Date of Patent: May 19, 2020

(54) DISPLAY PANEL

(71) Applicant: LG Display Co., Ltd., Seoul (KR)

(72) Inventor: JeongKi Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 15/846,053

(22) Filed: Dec. 18, 2017

(65) Prior Publication Data

US 2018/0188568 A1    Jul. 5, 2018

(30) Foreign Application Priority Data

Dec. 30, 2016 (KR) .......................... 10-2016-0183894

(51) Int. Cl.

| | |
|---|---|
| *G02F 1/1343* | (2006.01) |
| *G02F 1/1368* | (2006.01) |
| *G09G 3/3233* | (2016.01) |
| *H01L 29/786* | (2006.01) |
| *G09G 3/3275* | (2016.01) |
| *G09G 3/36* | (2006.01) |
| *H01L 27/12* | (2006.01) |
| *G09G 3/3266* | (2016.01) |
| *G02F 1/1362* | (2006.01) |
| *G09G 3/20* | (2006.01) |
| *G02F 1/1339* | (2006.01) |

(52) U.S. Cl.
CPC .......... *G02F 1/1343* (2013.01); *G02F 1/1368* (2013.01); *G02F 1/136204* (2013.01); *G09G 3/20* (2013.01); *G09G 3/3233* (2013.01); *G09G 3/3266* (2013.01); *G09G 3/3275* (2013.01); *G09G 3/3677* (2013.01); *H01L 27/1225* (2013.01); *H01L 29/7869* (2013.01); *G02F 1/1339* (2013.01); *G02F 1/136286* (2013.01); *G09G 2300/0426* (2013.01); *G09G 2330/06* (2013.01)

(58) Field of Classification Search
CPC ................ G02F 1/1343; G02F 1/1368; G02F 1/136204; G09G 3/20; G09G 3/3233; G09G 3/3266; G09G 3/3275
See application file for complete search history.

(56) References Cited

U.S. PATENT DOCUMENTS

| | | | |
|---|---|---|---|
| 8,767,162 B2 * | 7/2014 | Song | G02F 1/13394 349/154 |
| 10,424,603 B2 * | 9/2019 | Lee | H01L 27/124 |
| 2002/0000961 A1 * | 1/2002 | Kang | G02F 1/13452 345/87 |
| 2002/0057393 A1 * | 5/2002 | Park | G02F 1/13458 349/43 |

(Continued)

*Primary Examiner* — Sejoon Ahn
(74) *Attorney, Agent, or Firm* — Fenwick & West LLP

(57) ABSTRACT

Disclosed is a display panel with a robust structure to external static electricity. A sealant is disposed on a side surface and an upper surface of a signal line portion disposed on the outermost circumferential portion of the display panel to increase the distance between the signal line and the outside, and blocks external static elasticity. The signal line portion on the outermost circumferential portion of the display panel is in the form of a bulk electrode or in a mesh pattern comprised of horizontal lines and vertical lines having different structures. Externally introduced static elasticity is easily discharged, and signal lines are prevented from being damaged.

15 Claims, 10 Drawing Sheets

(56) References Cited

U.S. PATENT DOCUMENTS

| | | | |
|---|---|---|---|
| 2003/0117356 A1* | 6/2003 | Moon | G02F 1/13452 345/87 |
| 2003/0117566 A1* | 6/2003 | Park | G02F 1/13452 349/149 |
| 2003/0189685 A1* | 10/2003 | Choi | G02F 1/1345 349/149 |
| 2004/0021616 A1* | 2/2004 | Goto | G09G 3/3644 345/1.1 |
| 2004/0027526 A1* | 2/2004 | Pai | G02F 1/13452 349/149 |
| 2004/0027527 A1* | 2/2004 | Pai | G02F 1/13452 349/149 |
| 2004/0061694 A1* | 4/2004 | Noguchi | G09G 3/3233 345/204 |
| 2006/0146218 A1* | 7/2006 | Her | G02F 1/1368 349/43 |
| 2008/0002130 A1* | 1/2008 | Kil | G02F 1/1345 349/149 |
| 2010/0045918 A1* | 2/2010 | Han | G02F 1/1343 349/149 |
| 2010/0309421 A1* | 12/2010 | Gotoh | G02F 1/136259 349/152 |
| 2011/0096258 A1* | 4/2011 | Shim | G02F 1/1333 349/39 |
| 2011/0134104 A1* | 6/2011 | Yoon | G09G 3/3677 345/212 |
| 2013/0235279 A1* | 9/2013 | Sugisaka | G02F 1/1345 348/739 |
| 2014/0118321 A1* | 5/2014 | Kim | G09G 3/22 345/212 |

* cited by examiner

DISPLAY PANEL

CROSS REFERENCE TO RELATED APPLICATION

This application claims priority from Korean Patent Application No. 10-2016-0183894 filed on Dec. 30, 2016, which is hereby incorporated by reference for all purposes as if fully set forth herein.

BACKGROUND

Field

The present disclosure relates to a display panel.

Description of Related Art

In response to the development of the information society, there has been increasing demand for display devices able to display images. Recently, a range of display devices, such as liquid crystal display (LCD) devices, plasma display panels (PDPs), and organic light-emitting display devices, have come into widespread use.

Such a display device includes a display panel on which a plurality of gate lines, a plurality of data lines, and a plurality of sub-pixels are disposed, a gate driver to drive the gate lines, a data driver to drive the data lines, and a controller to control the driving of the gate driver and the data driver.

The display device is able to display images by supplying data voltages through data lines in response to the timing of scanning signals being applied through gate lines so that respective sub-pixels depict grayscales according to the data voltages.

The display panel of the display device consists of a display area in which sub-pixels and the like for displaying images are disposed and a non-display area located outside of the display area. Signal lines, driving circuits, and the like are disposed in the non-display area.

Thus, it should be necessary for the non-display area of the display panel to block external static electricity or the like. However, there is a problem in that as the display device is required to be made narrower and slimmer, the non-display area of the display panel is made narrower, so that the signal lines and the like disposed in the non-display area are to be exposed externally, being vulnerable to external static electricity.

BRIEF SUMMARY

One or more embodiments of the present disclosure provide a display panel and a display device having the same, configured to block external static electricity from being introduced to lines disposed in a non-display area of the display panel.

Also provided are a display panel and a display device having the same, configured to easily discharge external static electricity from lines disposed in a non-display area of the display panel.

According to an aspect of the present disclosure, a display panel has a display area and a non-display area located outside of the display area. The display panel may include: a display area; a first signal line portion disposed along an outer peripheral portion of the display area; a second signal line portion disposed along an outer peripheral portion of the first signal line portion to be spaced from the first signal line portion; and a sealant disposed on at least a portion of outer peripheral portion of the second signal line to be disposed on a side surface and an upper surface of the second signal line portion.

Here, the sealant may be disposed between the first signal line portion and the second signal line portion, on at least a portion of an upper surface of the first signal line portion.

A voltage for driving the display panel may be applied to the first signal line portion, and a ground voltage may be applied to the second signal line portion.

Here, the first signal line portion may have a mesh pattern, and at least a portion of the second signal line portion may be in the form of a bulk electrode.

Alternatively, the second signal line portion may have a mesh pattern comprised of first lines disposed in a first direction and second lines disposed in a second direction, perpendicular to the first direction.

Here, the number of the first lines may be different from the number of the second lines. For example, the number of one type of lines among the first lines and the second lines, disposed in parallel with an edge of the display area, may be greater than the number of the remaining type of lines among the first lines and the second lines.

In one aspect, the number of one type of lines among the first lines and the second lines is disposed in between the edge of the display area and an edge of the display panel and in parallel with the edge of the display area and the edge of the display panel, and the number of the remaining type of lines among the first lines and the second lines is disposed in between the edge of the display area and the edge of the display panel.

In one aspect, a spacing between adjacent lines of the one type of lines among the first lines and the second lines may be less than the spacing between adjacent lines of the remaining type of lines among the first lines and the second lines.

Further, the thicknesses of the first lines may be different from the thicknesses of the second lines. For example, the thickness of one type of lines among the first lines and the second lines, disposed in parallel with an edge of the display area, may be greater than the thickness of the remaining type of lines among the first lines and the second lines.

According to another aspect of the present disclosure, a display panel may include: a display area; a first signal line portion disposed along an outer peripheral portion of the display area; and a second signal line portion disposed along an outer peripheral portion of the first signal line portion to be spaced from the first signal line portion, at least a portion of the second signal line portion being in a form of a bulk electrode.

According to another aspect of the present disclosure, a display panel may include: a display area; a first signal line portion disposed along an outer peripheral portion of the display area; and a second signal line portion disposed along an outer peripheral portion of the first signal line portion to be spaced from the first signal line portion, wherein the second signal line portion having a mesh pattern, comprised of first lines disposed in a first direction and second lines disposed in a second direction, perpendicular to the first direction, wherein the number or thickness of the first lines is different from the number or thickness of the second lines.

According to exemplary embodiments of the present disclosure, lines disposed in the non-display area of the display panel are internally covered by the sealant disposed on the lines, thereby preventing static electricity from being externally introduced to the lines.

According to exemplary embodiments of the present disclosure, in an outermost circumferential portion of the non-display area of the display panel, lines are disposed in the form of a bulk electrode or in a mesh pattern, such that vertical lines and horizontal lines are disposed differently. Consequently, static electricity introduced to lines in the non-display area can be easily discharged from the lines.

BRIEF DESCRIPTION OF THE DRAWINGS

The above and other objects, features and advantages of the present disclosure will be more clearly understood from the following detailed description when taken in conjunction with the accompanying drawings.

DETAILED DESCRIPTION

Figure 1:
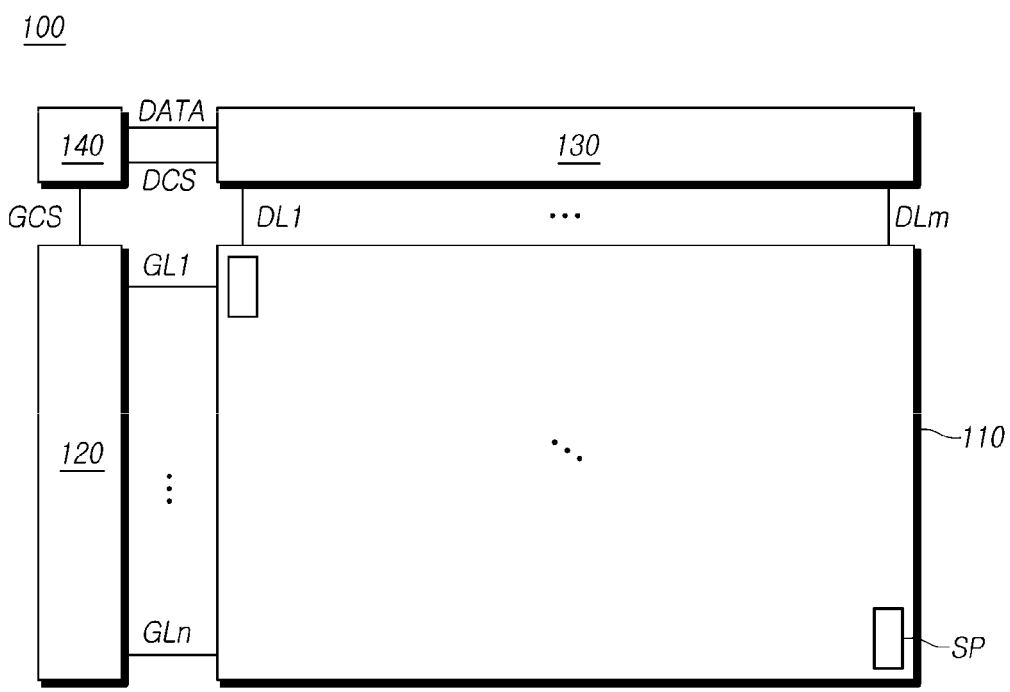
FIG. 1 illustrates a schematic configuration of a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 illustrates a schematic configuration of a display device 100 according to exemplary embodiments.

Referring to FIG. 1, the display device 100 includes a display panel 110 having an arrangement of a plurality of gate lines GL1 to GLn, an arrangement of a plurality of data lines DL1 to DLm, and a plurality of sub-pixels disposed at positions in which the gate lines GL1 to GLn cross the data lines DL1 to DLm.

Further, the display panel includes a data driver 120 to drive the gate lines GL1 to GLn, a data driver 130 to supply data voltages to the data lines DL1 to DLm, and a controller 140 to control the driving of the gate driver 120 and the data driver 130.

The gate driver 120 serves to sequentially supply scanning signals (gate signals) to the gate lines GL1 to GLn to sequentially drive the gate lines GL1 to GLn.

That is, the gate driver 120 serves to sequentially supply gate signals of voltage-on/off signals to the gate lines GL1 to GLn under the control of the controller 140 to sequentially drive the gate lines GL1 to GLn.

The gate driver 120 may be positioned on either one or both sides of the display panel 110 according to the driving method thereof.

Further, the gate driver 120 may include one or more gate driver integrated circuits (ICs).

The gate drivers IC may be connected to the bonding pads of the display panel 110 by tape-automated bonding (TAB) or by a chip-on-glass (COG) method or may otherwise be gate-in-panel (GIP) gate driver ICs, which are directly mounted on the display panel 110.

Further, the gate driver IC may be integrated to the display panel 110 or may otherwise be chip-on-film (COF) gate driver ICs, which are surface-mounted on a film connected to the display panel 110.

The data driver 130 serves to supply a data voltage to the data lines DL1 to DLm to drive the data lines DL1 to DLm.

That is, the data driver 130 serves to convert video data received from the controller into a data voltage in an analog form and supply it to the data lines DL1 to DLm when a specific gate line is opened, thereby driving the data lines DL1 to DLm.

The data driver 130 may have at least one source driver integrated circuit (IC) to drive the data lines DL1 to DLm.

The source driver IC may be connected to a bonding pad of the display panel 110 by TAB, may be COG source driver ICs, which are directly mounted on the display panel 110, or may otherwise be integrated to the display panel 110.

Further, the source driver IC may be implemented by the COF method. In this case, one end of the source driver IC is bonded to at least one source printed circuit board (PCB) and the other end there of the source driver IC of is bonded to the display panel 110.

The controller 140 serves to supply a variety of control signals to the gate driver 120 and the data driver 130 to control the gate driver 120 and the data driver 130.

The controller 140 serves to start scanning in response to timing realized by respective frames, convert external input video data into video data suitable for a data signal format to be used by the data driver 130, and output the converted video data to control the driving of the data at suitable points in time in accordance with the scanning.

The controller 140 receives, in addition to the input video data, a variety of timing signals including a vertical synchronous signal (Vsync), a horizontal synchronous signal (Hsync), an input data enable (DE) signal, a clock signal (CLK), and the like, from an external source (e.g. a host system).

The controller 140 not only converts external input video data to video data suitable for the data signal format to be used by the data driver 130 and outputting the converted video data, but also generates a variety of control signals by receiving a variety of timing signals, including a vertical synchronous signal (Vsync), a horizontal synchronous signal (Hsync), an input data enable (DE) signal, a clock signal (CLK), and the like, and outputs the variety of control signals to the gate driver 120 and the data driver 130 in order to control the gate driver 120 and the data driver 130.

For example, the controller 140 outputs a variety of gate control signals (GCSs) including a gate start pulse signal (GSP), a gate shift clock signal (GSC), a gate output enable signal (GOE), and the like in order to control the gate driver 120.

Here, the GSP controls the operation start timing of one or more gate driver ICs constituting the gate driver 120. The GSC is a clock signal that is commonly input to the one or more gate driver ICs to control the shift timing of a gate signal. The GOE designates the timing information of the one or more gate driver ICs.

Further, the controller 140 outputs a variety of data control signals (DCSs), including a source start pulse signal (SSP), a source sampling clock signal (SSC), a source output enable signal (SOE), and the like, in order to control the data driver 130.

Here, the SSP controls the data sampling start timing of the one or more source driver ICs constituting the data driver 130. The SSC is a clock signal that controls the timing of the data sampling of the respective source driver ICs. The SOE controls the output timing of the data driver 130.

The controller 140 is disposed on a control PCB connected to a source PCB, to which the source driver ICs are bonded, via a connection media such as a flexible flat cable (FFC) or a flexible printed circuit (FPC).

The control PCB may further be provided with a power controller (not shown) to supply voltages or currents to the display panel 110, the gate driver 120, the data driver 130, and the like or to control voltages or currents to be supplied thereto. The power controller may also be referred to as a power management IC.

The display panel 110 of the display device 100 may be comprised of a display area A/A in which the plurality of sub-pixels are disposed to display images and a non-display area N/A located outside of the display area A/A.

The sub-pixels and the like for displaying images are located in the display area A/A of the display panel 110, while lines and the like for transferring signals to the sub-pixels in the display area A/A are located in the non-display area N/A.

Figure 2A:
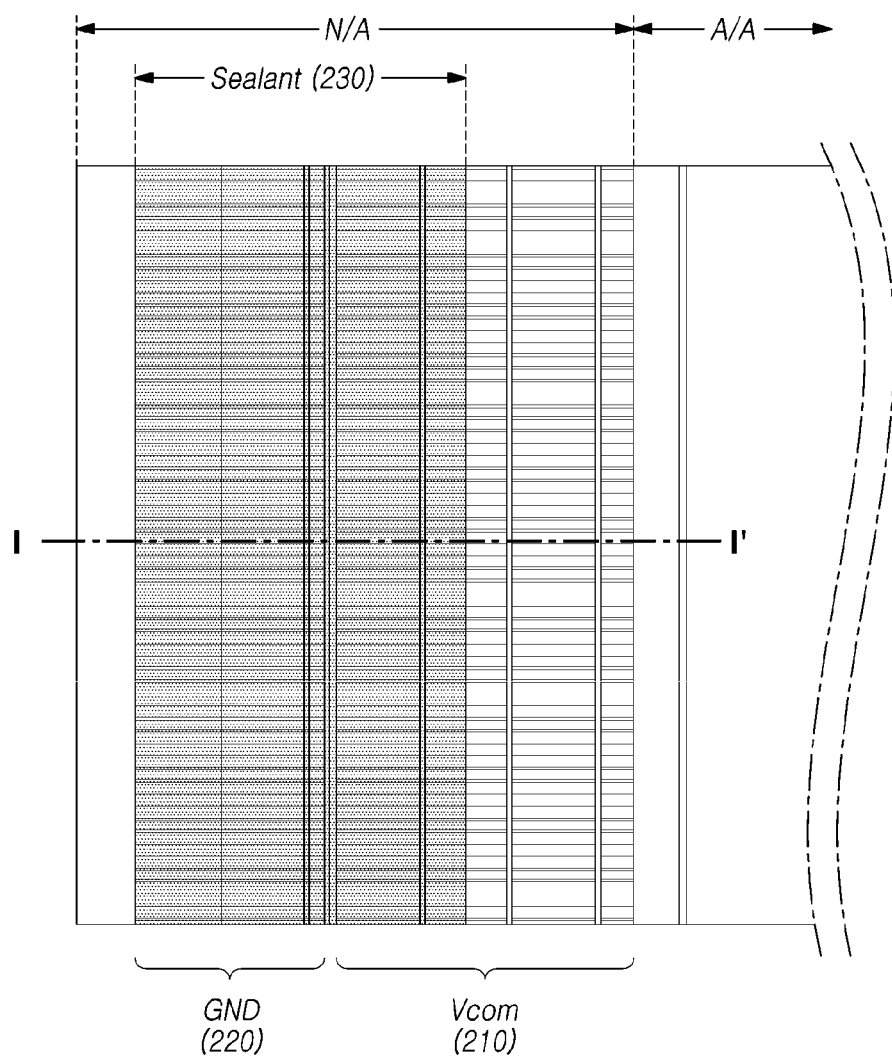
FIGS. 2A and 2B illustrate exemplary structures in which lines are disposed in a non-display area of a display panel according to exemplary embodiments.
Figure 2B:
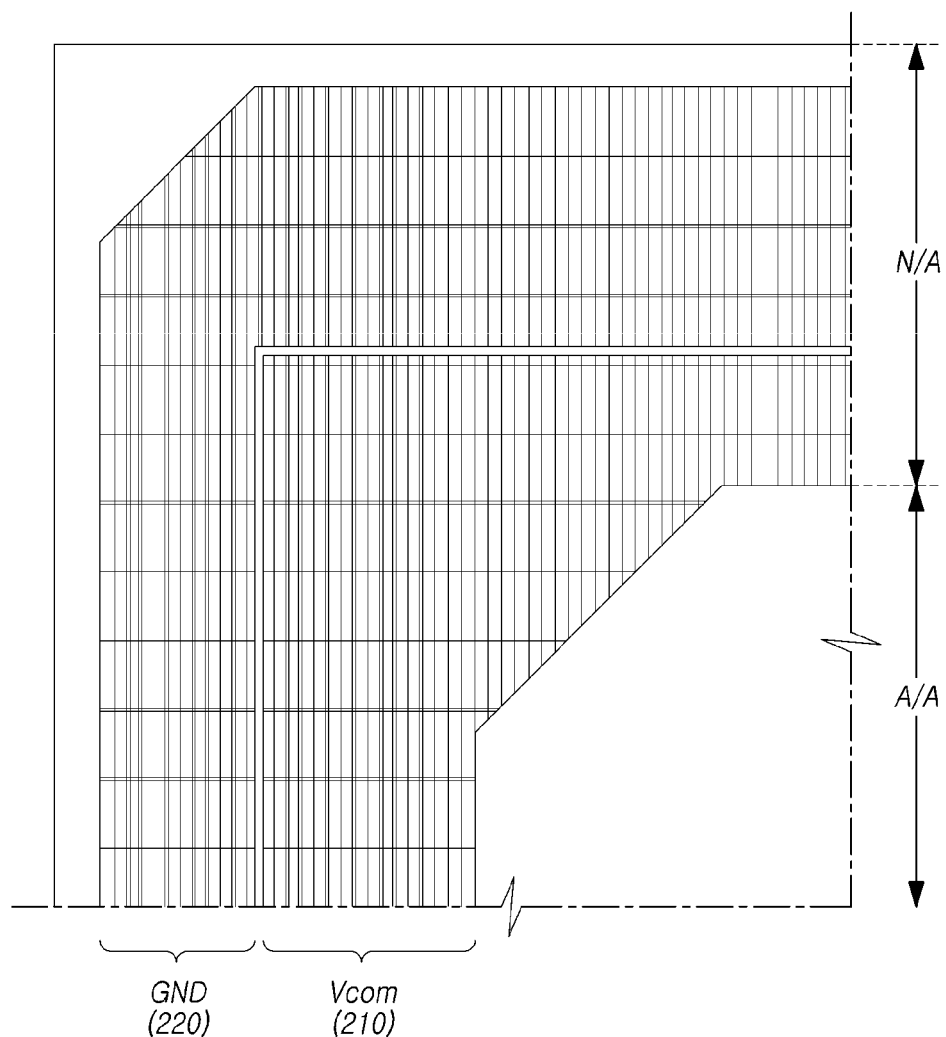

FIGS. 2A and 2B illustrate exemplary structures in which lines are disposed in the non-display area N/A of the display panel 110 of the display device 100 according to exemplary embodiments.

FIG. 2A illustrates the structure in which lines are disposed in a portion of the non-display area N/A of the display panel 110, corresponding to a peripheral portion of the display panel 110.

Referring to FIG. 2A, a first signal line portion 210 is disposed in a portion of the non-display area N/A of the display panel 110, adjacent to the display area A/A, along the outer peripheral portion of the display area A/A. Further, a second signal line portion 220 is spaced from, and along an outer peripheral portion of, the first signal line portion 210.

The first signal line portion 210 is comprised of a plurality of signal lines to which a voltage is applied to drive the display area A/A of the display panel 110. For example, the first signal line portion may be lines through which a common voltage is applied to a common electrode disposed in the display area A/A. The common electrode may be an electrode that is shared between several LCD pixels.

The second signal line portion 220 is comprised of a plurality of signal lines through which static electricity generated in the interior of the display panel 110 can be discharged. The second signal line portion 220 may be referred to as a static discharge signal line. A ground voltage may be applied to the second signal line portion 220.

The second signal line portion 220 may be spaced apart from the outermost peripheral portion of the display panel 110 by a predetermined distance.

A sealant 230 is disposed on the upper surface of the second signal line portion 220, as well as on a portion of the upper surface of the first signal line portion 210. The sealant 230 is used to connect two substrates, for example, an upper and lower substrate (e.g., color filter substrate and thin film transistor substrate) of a LCD to seal in liquid crystal.

FIG. 2B illustrates the structure in which lines are disposed in a portion of the non-display area N/A of the display panel 110, corresponding to an apex of the display panel 110.

Referring to FIG. 2B, a first signal line portion 210 is disposed in the non-display area N/A of the display panel 110 along an outer peripheral portion of the display area A/A, while a second signal line portion 220 is disposed along an outer peripheral portion of the first signal line portion 210 to be spaced from the first signal line portion 210 by a predetermined distance.

However, the lines disposed in the non-display area N/A of the display panel 110 may suffer from static electricity introduced from the outside of the display panel 110, since the lines are disposed on the outermost portion of the display panel 110.

Figure 3:
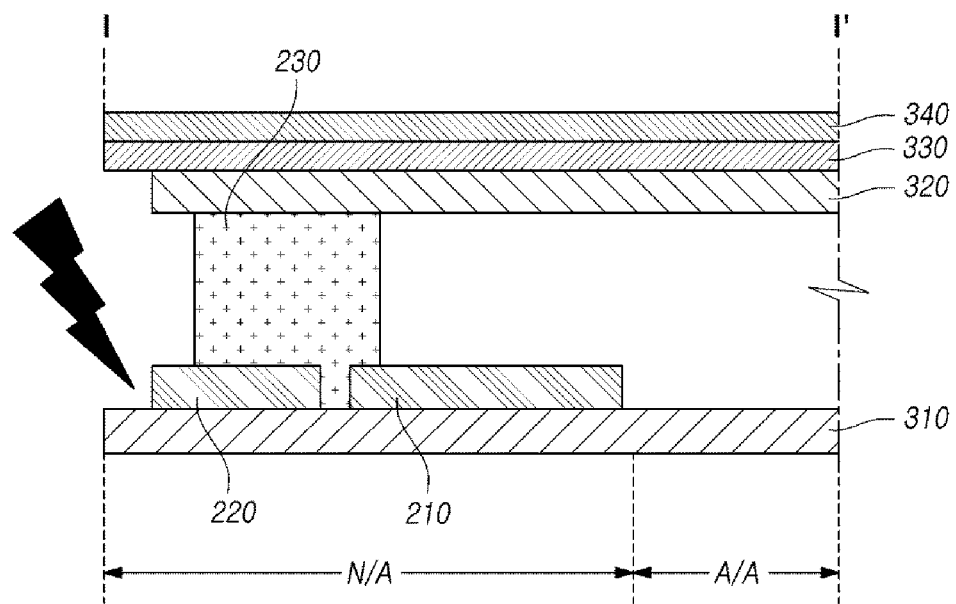
FIG. 3 is a cross-sectional view taken along line I-I' in FIG. 2A.

Reference will now be made to FIG. 3 illustrating a cross-sectional view taken along line I-I' in FIG. 2A.

As illustrated in FIG. 3, in the display panel 110, a signal line 200 is disposed on a thin film transistor 310, and a sealant 230 is provided on the signal line 200. The "signal line 200" mentioned herein collectively refers to the first signal line portion 210 and the second signal line portion 220.

Further, a black matrix 320, a color filter substrate 330, and a transparent electrode 340 may be sequentially disposed on the sealant 230.

Here, static electricity may be externally introduced to the signal line 200 disposed on an outermost edge of the display panel 110.

More particularly, since a bezel, a portion corresponding to the non-display area N/A of the display panel 110, is made narrower, static electricity may easily be introduced to the signal line 200 disposed in the non-display area N/A.

Thus, static electricity may be introduced to the signal line 200 disposed in the non-display area N/A, thereby damaging the signal line 200 (e.g., particularly the first signal line portion 210), which may in turn cause an error in images displayed on the display panel.

In this regard, the display panel 100 provides the structure able to prevent static electricity from being introduced to the lines disposed on the outermost portion of the display panel 110 and to easily discharge the static electricity introduced to the lines.

Figure 4A:
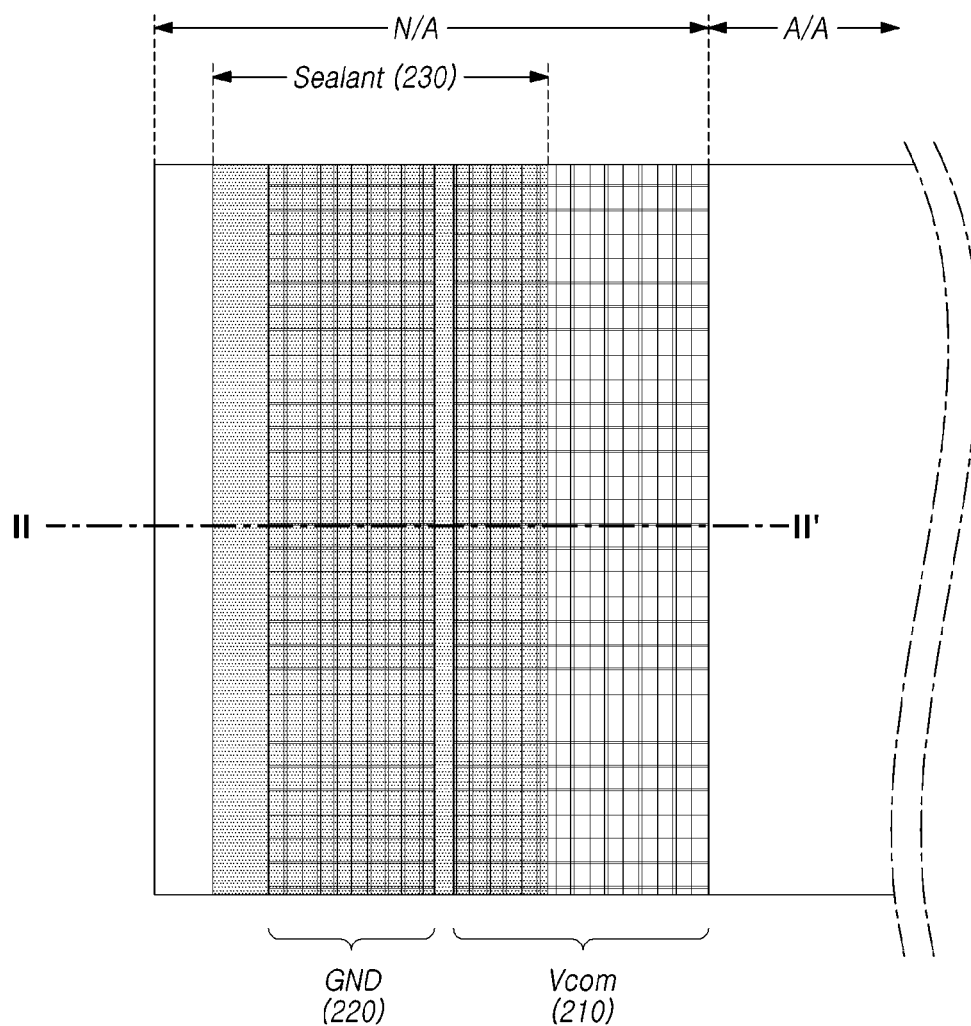
FIGS. 4A and 4B illustrate other exemplary structures in which lines are disposed in a non-display area of a display panel according to exemplary embodiments.
Figure 4B:
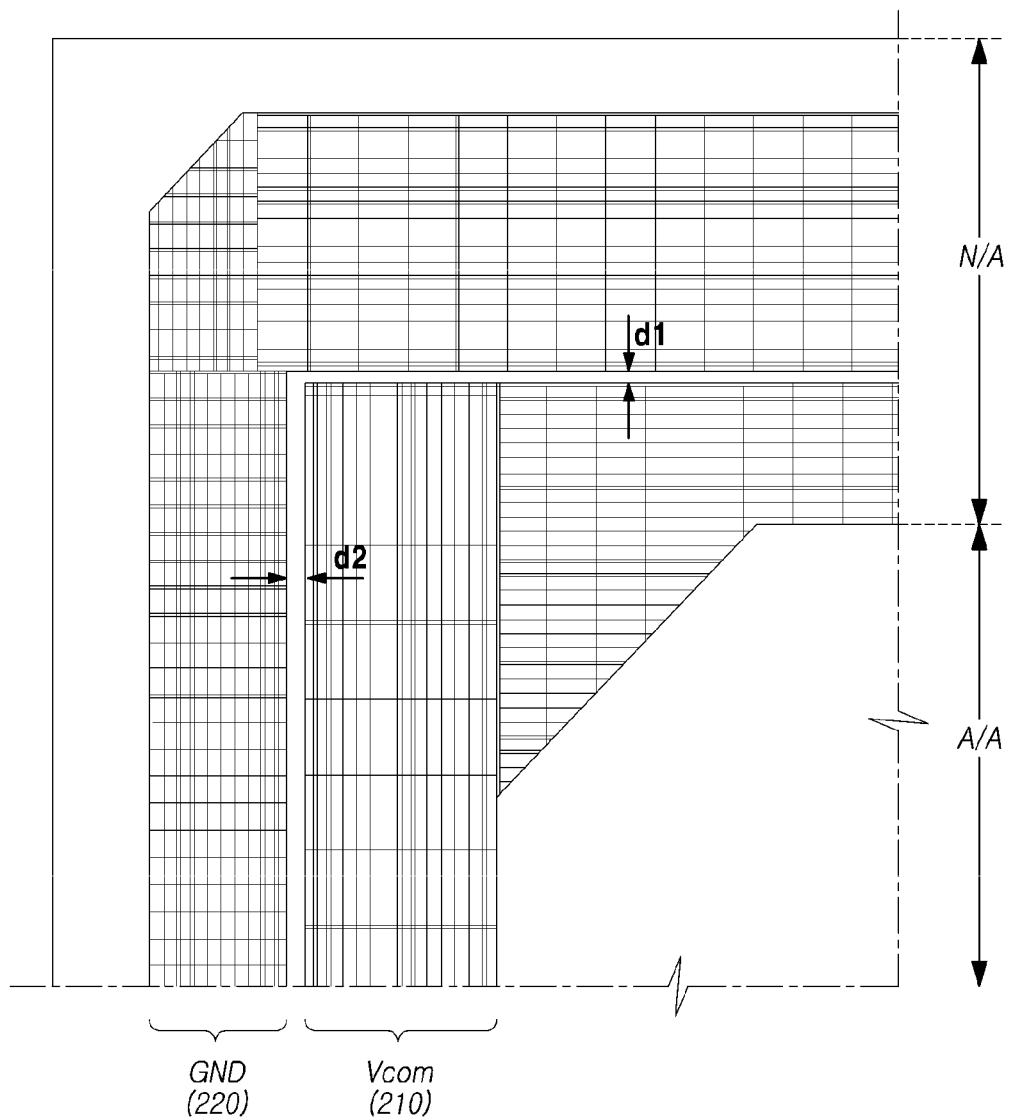

FIGS. 4A and 4B illustrate other exemplary structures in which lines are disposed in the non-display area N/A of the display panel 110 according to exemplary embodiments.

FIG. 4A illustrates a portion of the non-display area N/A of the display panel 110 corresponding to a corner of the display panel 110.

Referring to FIG. 4A, a first signal line portion 210 is disposed in a portion of the non-display area N/A of the display panel 110, adjacent to the display area A/A, along an outer peripheral portion of the display area A/A, while a second signal line portion 220 is disposed along an outer peripheral portion of the first signal line portion 210.

The second signal line portion 220 is spaced from the first signal line portion 210 by a predetermined distance, and a sealant 230 is disposed on the upper surface of the second signal line portion 220. The second signal line portion 220 can be electrically insulated from the first signal line portion 210.

Here, the sealant 230 is disposed on the upper surface of the second signal line portion 220, as well as along the outer peripheral portion of the second signal line portion 220.

Specifically, the sealant 230, disposed on a signal line 200 in the non-display area N/A of the display panel 110, is located on both the outer peripheral portion (i.e. the side surface) and the upper surface of the second signal line portion 220 in the outermost portion of the non-display area N/A. The outer peripheral portion of the second signal line portion 220 or the side surface is the outward facing side surface facing away from the display area and towards the display edge. The term "signal line 200" collectively refers to the first signal line portion 210 and the second signal line portion 220.

Due to this configuration, the second signal line portion 220 can be isolated from the outside by a distance equal to the width of the sealant 230 that extends beyond the edge of the second signal line portion 220. Further, as the sealant 230 is disposed outside of the second signal line portion 220, static electricity generated externally from the display panel 110 can be prevented from being introduced to the second signal line portion 220.

The sealant 230 is disposed between the first signal line portion 210 and the second signal line portion 220 and is disposed on a portion of the upper surface of the first signal line portion 210.

Since the sealant 230 separates the second signal line portion 220 from the first lines 210 while surrounding the outer peripheral portion of the second signal line portion 220, externally generated static electricity can be prevented from being introduced to the second signal line portion 220, and internally generated static electricity can be discharged through the second signal line portion 220 without having an effect on the first signal line portion 210.

FIG. 4B illustrates a portion of the non-display area N/A of the display panel 110, corresponding to an apex of the display panel 110.

Referring to FIG. 4B, in the non-display area N/A of the display panel 110, a first signal line portion 210 is disposed along the outer peripheral portion of the display area A/A, and a second signal line portion 220 is disposed along the outer peripheral portion of the first signal line portion 210.

The first and second signal line portions 210 and 220 are spaced from each other by a predetermined distance.

Here, the predetermined distance separating the first and second signal line portion 210 and 220 may be based on a corresponding width of the second signal line portion 220 (e.g., a width of the second signal line portion 220 adjacent to the spacing, the width in a same direction of the separation).

For example, as illustrated in FIG. 4B, the width of the second signal line portion 220 disposed in the upper portion of the non-display area N/A of the display panel 110 may be wider than that of the second signal line portion 220 disposed in the left portion of the non-display area N/A.

In this case, the distance d1 between the first and second signal line portion 210 and 220 in the upper portion of the non-display area N/A may be smaller than the distance d2 between the first and second signal line portion 210 and 220 in the left portion of the non-display area N/A.

Specifically, in the case in which it is difficult to transfer static electricity to the first signal line portion 210 due to the wider width of the second signal line portion 220 disposed in the outermost portion of the non-display area N/A, the distance between the first and second signal line portion 210 and 220 is made smaller to provide a narrower bezel.

Further, when the second signal line portion 220 disposed in the outermost portion of the non-display area N/A has a narrower width, the distance between the first and second signal line portion 210 and 220 can be increased to protect the first signal line portion 210 from static electricity.

Figure 5:
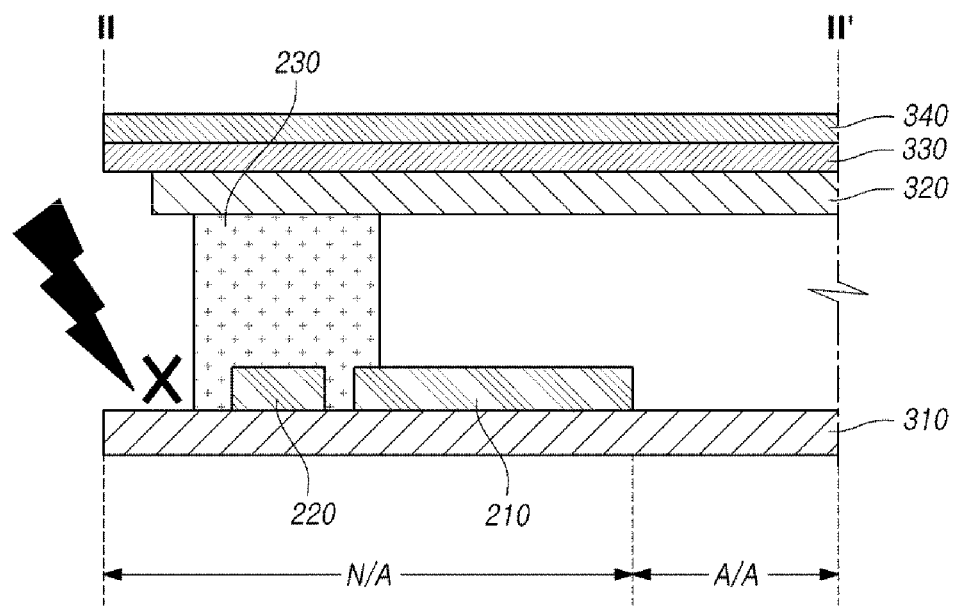
FIG. 5 is a cross-sectional view taken along line II-II' in FIG. 4A.

FIG. 5 is a cross-sectional view taken along line II-II' in FIG. 4A.

Referring to FIG. 5, in the display panel 110, a thin film transistor substrate 310 is disposed, and a signal line 200 is disposed on an upper surface of the thin film transistor 310.

A sealant 230 is disposed on a side surface and an upper surface of the signal line 200. The side surface is the outward facing side surface that faces away from the display area and towards the display edge. A black matrix 320, a color filter substrate 330, and a transparent electrode 340 are sequentially disposed on an upper surface of the sealant 230.

Since the sealant 230 is disposed on the upper surface of the signal line 200 while covering the outer peripheral portion of the second signal line 200, the display panel 110 can be shielded from static electricity externally introduced thereto.

Thus, although the bezel of the display panel 110 is made narrower, it is possible to prevent static electricity from being introduced to the signal line 200 disposed on the outermost portion of the display panel 110, thereby preventing static electricity from damaging the signal line 200.

In addition, the display panel 110 provides a structure able to prevent static electricity from being introduced to the lines disposed on the outermost portion of the display panel 110 and to easily discharge static electricity if any static electricity is introduced to the lines.

Figure 6:
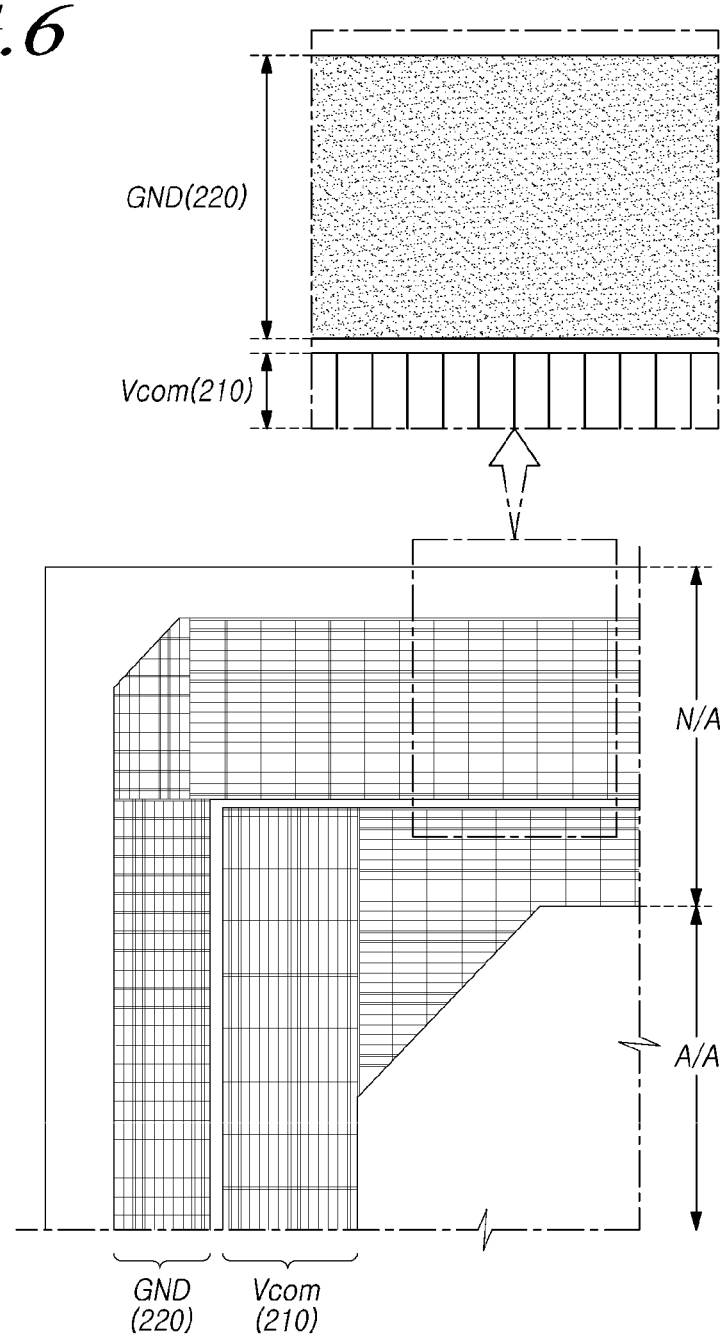
FIGS. 6, 7, and 8 illustrate further exemplary structures in which lines are disposed in a non-display area of a display panel according to exemplary embodiments.

FIG. 6 is a view illustrating an exemplary structure in which lines are disposed in a non-display area N/A of the display panel 110 according to exemplary embodiments.

Referring to FIG. 6, a first signal line portion 210 is disposed in the non-display area N/A of the display panel 110 along an outer peripheral portion of the display area A/A, and a second signal line portion 220 is disposed along an outer peripheral portion of the first signal line portion 210.

The first signal line portion 210 may be disposed in a mesh pattern in which lines cross each other, and a second signal line portion 220 may be disposed in a mesh pattern, similarly to the first signal line portion 210.

Here, at least a portion of the second signal line portion 220 may be provided in the form of a bulk electrode to cover an entire area where the lines are disposed.

That is, the second signal line portion 220 disposed on the outermost portion of the display panel 110 may be in the form of a bulk electrode or may be a combination of a mesh pattern and a bulk electrode.

Since the second signal line portion 220 is disposed in the bulk electrode, even in the case in which static electricity is introduced to the second signal line portion 220, it is possible to prevent overloading of the second signal line portion while allowing the introduced static electricity to be easily discharged therefrom.

Thus, since the second signal line portion 220 disposed on the outermost portion of the display panel 110, to which static electricity is frequently introduced, is provided in the form of a bulk electrode, even in the case in which static electricity is introduced to the second signal line 200, the second signal line portion 220 is prevented from being damaged and the first signal line portion 210 is also prevented from being influenced by the static electricity.

Further, in the case in which the second signal line portion 220 is disposed in a mesh pattern, the second signal line portion 220 may have a structure in which horizontal lines and vertical lines have different configurations such that static electricity introduced to the second signal line portion 220 can be easily discharged therefrom.

Figure 7:
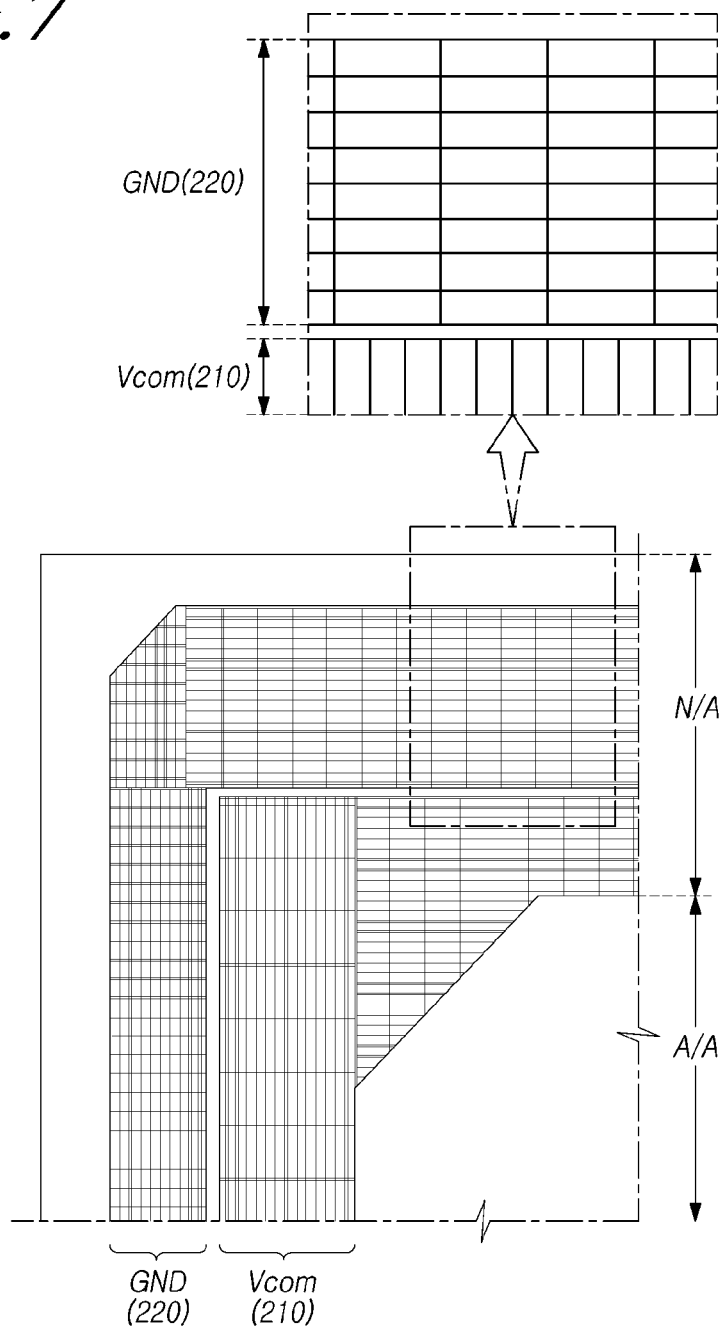
Figure 8:
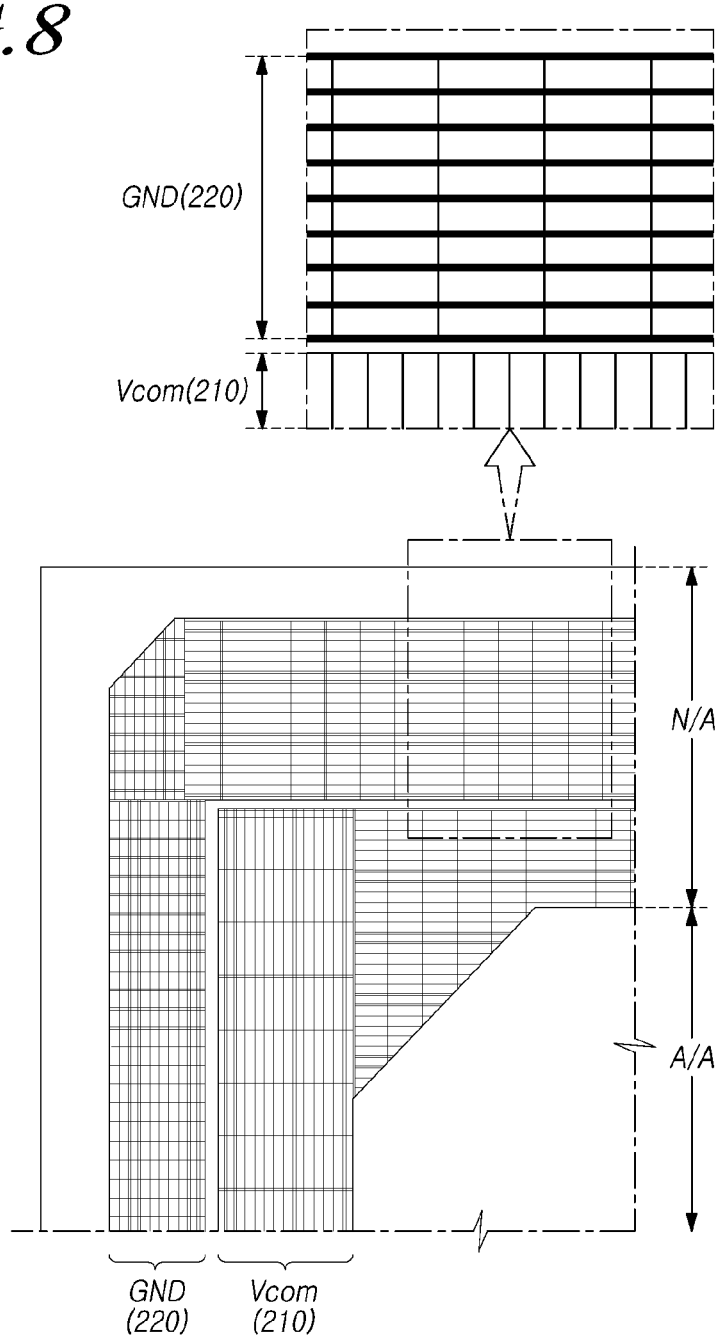

FIGS. 7 and 8 illustrate exemplary structures in which the second signal line portion 220 disposed on the outermost portion of the display panel 110 is disposed in a mesh pattern.

Referring to FIG. 7, a mesh-patterned first signal line portion 210 is disposed in the non-display area N/A of the display panel 110 along the outer portion of the display area A/A, and a mesh-patterned second signal line portion 220 is disposed along the outer portion of the first signal line portion 210.

The second signal line portion 220 may be comprised of first lines oriented in a first direction and second lines oriented in a second direction crossing the first direction.

Here, in the second signal line portion 220, the number of the first lines may differ from the number of the second lines.

For example, the number of one type of lines among the first lines and the second lines of the second signal line portion 220, disposed in parallel with the display area A/A, may be greater than the number of the remaining type of lines.

In one aspect, the number of one type of lines among the first lines and the second lines is disposed in between the edge of the display area and an edge of the display panel and in parallel with the edge of the display area and the edge of the display panel, and the number of the remaining type of lines among the first lines and the second lines is disposed in between the edge of the display area and the edge of the display panel.

In another example, the density of one type of lines among the first lines and the second lines of the second signal line portion 220, disposed in parallel with the display area A/A, may be greater than the density of the remaining type of lines.

In another example, the spacing of adjacent lines of one type of lines among the first lines and the second lines of the second signal line portion 220, disposed in parallel with the display area A/A, may be closer than the spacing between adjacent lines of the remaining type of lines.

As illustrated in FIG. 7, in the second signal line portion 220 disposed in the upper portion of the non-display area N/A, the number of the lines disposed horizontally to be in parallel with the display area A/A is greater than that of the remaining lines that are disposed vertically.

Further, in the case of the second signal line portion 220 disposed in the left portion of the non-display area N/A, the number of the lines disposed vertically to be in parallel with the display area A/A is greater than that of the horizontally disposed lines.

Since the greater number of the lines are disposed perpendicularly to the direction in which static electricity is introduced to the second signal line portion 220, the static electricity being introduced to the second signal line portion 220 can be guided in a direction in parallel with the display area A/A without being delivered to the first signal line portion 210.

Thus, even in the case in which static electricity is introduced to the second signal line portion 220 on the outermost portion of the display panel 110, the static electricity is guided to a path on which the static electricity can be discharged without being delivered to the first signal line portion 210. Consequently, the signal line 200 disposed in the non-display area N/A of the display panel 110 can be prevented from being damaged by static electricity introduced thereto from the outside of the display panel 110.

FIG. 8 illustrates another exemplary structure in which a second signal line portion 220 is disposed on an outermost portion of the display panel 110 in a mesh pattern.

Referring to FIG. 8, a first signal line portion 210 having a mesh pattern is disposed in the non-display area N/A along the outer peripheral portion of the display area A/A, and a second signal line portion 220 having a mesh pattern is disposed along the outer peripheral portion of the first signal line portion 210.

The second signal line portion 220 may be comprised of first lines disposed in a first direction and second lines disposed in a second direction crossing the first direction.

Here, in the second signal line portion 220, the thickness of the first lines may differ from the thickness of the second lines crossing the first lines.

For example, the thickness of one type of lines among the first lines and the second lines of the second signal line portion 220 disposed in parallel with the display area A/A may be greater than that of the remaining type of lines.

Specifically, the thickness of the lines disposed horizontally in the upper portion of the non-display area N/A is thicker than the thickness of the vertically disposed lines, while the thickness of the lines disposed vertically in the left portion of the non-display area N/A is thicker than the thickness of the horizontally disposed lines.

Since, the thickness of the lines disposed in a specific direction is thicker than that of the remaining lines in the mesh-patterned second signal line portion 220 comprised of crossing lines, static electricity introduced to the second signal line portion 220 is guided to be flow along the thicker lines.

Since the lines of the second signal line portion 220 disposed in parallel with the display area A/A are made thicker, static electricity introduced to the second signal line portion 220 can be easily discharged without having an effect on the first signal line portion 210.

According to embodiments, since the signal line 200 is disposed in the outermost portion of the non-display area N/A of the display panel 110 while being located inside of the sealant 230, static electricity can be prevented from being introduced to the signal line 200 in the non-display area N/A or damaging the signal line 200.

This feature consequently provides the display panel with a structure that is more robust to external static electricity while further reducing the bezel of the display panel.

In addition, since a line portion disposed on the outermost portion of the display panel 110 is provided in the form a bulk electrode or in a mesh pattern in which vertical lines and horizontal lines have different configurations, static electricity introduced to the outermost portion of the display panel 110 can be easily discharged therefrom.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. A display panel comprising:
a display area;
a first signal line portion disposed along an outer peripheral portion of the display area;
a second signal line portion disposed along an outer peripheral portion of the first signal line portion and spaced from the first signal line portion; and
a sealant disposed on at least a portion of an outer peripheral portion of the second signal line portion and disposed on a side surface and an upper surface of the second signal line portion,
wherein the second signal line portion includes a first type of lines disposed in a first direction and a second type of lines disposed in a second direction, perpendicular to the first direction, wherein a number of the first type of lines is different from a number of the second type of lines,
wherein one type of lines among the first type of lines and the second type of lines is disposed in between an edge of the display area and an edge of the display panel, and a remaining type of lines among the first type of lines and the second type of lines is disposed in between the edge of the display area and the edge of the display panel.

2. The display panel according to claim 1, wherein the first signal line portion has a mesh pattern, and at least a portion of the second signal line portion is in a form of a bulk electrode.

3. The display panel according to claim 1, wherein a number of the one type of lines, which is disposed in parallel with the edge of the display area, among the first type of lines and the second type of lines, is greater than a number of the remaining type of lines among the first type of lines and the second type of lines.

4. The display panel according to claim 3, wherein a spacing between adjacent lines of the one type of lines among the first type of lines and the second type of lines is less than the spacing between adjacent lines of the remaining type of lines among the first type of lines and the second type of lines.

5. The display panel according to claim 1, wherein thicknesses of the first type of lines is different from thicknesses of the second type of lines.

6. The display panel according to claim 5, wherein a thickness of the one type of lines among the first type of lines and the second type of lines, disposed in parallel with the edge of the display area, is greater than a thickness of the remaining type of lines among the first type of lines and the second type of lines.

7. The display panel according to claim 1, wherein the sealant is disposed between the first signal line portion and the second signal line portion, on at least a portion of an upper surface of the first signal line portion.

8. The display panel according to claim 1, wherein the first signal line portion is configured to receive a voltage for driving the display panel, and the second signal line portion is configured to receive a ground voltage.

9. The display panel according to claim 1, wherein the second signal line portion is a static discharge signal line portion.

10. The display panel according to claim 1, wherein the first signal line portion and the second signal line portion are in a non-display area of the display panel.

11. A display panel comprising:
a display area;
a first signal line portion disposed along an outer peripheral portion of the display area; and
a second signal line portion disposed along an outer peripheral portion of the first signal line portion and spaced from the first signal line portion,
wherein the second signal line portion has a mesh pattern, comprised of a first type of lines disposed in a first direction and a second type of lines disposed in a second direction, perpendicular to the first direction, wherein a number of the first type of lines is different from a number of the second type of lines,
wherein a thickness of the first type of lines is different from a thickness of the second type of lines,
wherein one type of lines among the first type of lines and the second type of lines is disposed in between an edge of the display area and an edge of the display panel, and a remaining type of lines among the first type of lines and the second type of lines is disposed in between the edge of the display area and the edge of the display panel.

12. The display panel according to claim 11, wherein a number of the one type of lines among the first type of lines and the second type of lines, disposed in parallel with the edge of the display area, is greater than a number of the remaining type of lines among the first type of lines and the second type of lines.

13. The display panel according to claim 12, wherein a spacing between adjacent lines of the one type of lines among the first type of lines and the second type of lines is less than the spacing between adjacent lines of the remaining type of lines among the first type of lines and the second type of lines.

14. The display panel according to claim 11, wherein a thickness of the one type of lines among the first type of lines and the second type of lines, disposed in parallel with the edge of the display area, is greater than a thickness of the remaining type of lines among the first type of lines and the second type of lines.

15. The display panel according to claim 11, wherein the first signal line portion is configured to receive a voltage for driving the display panel, and the second signal line portion is configured to receive a ground voltage.

* * * * *